(12) United States Patent
Lee

(10) Patent No.: US 11,258,037 B2
(45) Date of Patent: Feb. 22, 2022

(54) ADHESIVE AND FLEXIBLE DISPLAY USING THE SAME

(71) Applicant: LG Display Co., Ltd., Seoul (KR)

(72) Inventor: Seung-Hee Lee, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 39 days.

(21) Appl. No.: 16/196,178

(22) Filed: Nov. 20, 2018

(65) Prior Publication Data

US 2019/0165311 A1 May 30, 2019

(30) Foreign Application Priority Data

Nov. 30, 2017 (KR) .......................... 10-2017-0163548

(51) Int. Cl.
*C09J 7/28* (2018.01)
*H01L 51/52* (2006.01)
(Continued)

(52) U.S. Cl.
CPC ...... *H01L 51/5246* (2013.01); *C08G 18/3206* (2013.01); *C08G 18/48* (2013.01); *C08G 18/6674* (2013.01); *C08G 18/7671* (2013.01); *C09J 7/28* (2018.01); *C09J 133/08* (2013.01); *C09J 175/08* (2013.01); *G09F 9/301* (2013.01); *H01L 51/0097* (2013.01); *H01L 51/5237* (2013.01); *C09J 2203/318* (2013.01); *C09J 2301/1242* (2020.08); *C09J 2301/18* (2020.08);
(Continued)

(58) Field of Classification Search
CPC . C09J 7/28; C09J 133/08; C09J 175/08; C09J 2301/18; C09J 2301/1242; C09J 2203/318; C09J 2475/00; C08G 18/3206; C08G 18/48; C08G 18/6674; C08G 18/7671; H01L 51/5246; H01L 51/0097; H01L 51/5237; H01L 2251/5338; G09F 9/301; Y10T 428/14; Y10T 428/1438; Y10T 428/28; Y10T 428/2804
See application file for complete search history.

(56) References Cited

U.S. PATENT DOCUMENTS

| 7,482,197 B2 * | 1/2009 | Furman | ............... H01L 21/4882 |
| | | | 257/E21.023 |
| 2008/0251201 A1* | 10/2008 | Sikkel | ...................... C08J 5/121 |
| | | | 156/330 |

(Continued)

FOREIGN PATENT DOCUMENTS

| CN | 1934209 A | 3/2007 |
| CN | 102456640 A | 5/2012 |

(Continued)

OTHER PUBLICATIONS

Derwent Abstract of CN 106350751A. See above for date and inventor.*

(Continued)

*Primary Examiner* — Patricia L. Nordmeyer
(74) *Attorney, Agent, or Firm* — Seed IP Law Group LLP

(57) ABSTRACT

Provided is an adhesive provided by patterning a metal plate with a predetermined elastic modulus, wherein the adhesive is compressively deformed in response to an operation of an adherend to be folded, so that the adhesive can easily return to an original state thereof through formation of a plurality of inner neutral planes upon deformation.

12 Claims, 11 Drawing Sheets

(51) Int. Cl.
*H01L 51/00* (2006.01)
*G09F 9/30* (2006.01)
*C08G 18/76* (2006.01)
*C08G 18/32* (2006.01)
*C08G 18/66* (2006.01)
*C08G 18/48* (2006.01)
*C09J 175/08* (2006.01)
*C09J 133/08* (2006.01)

(52) U.S. Cl.
CPC ... *C09J 2475/00* (2013.01); *H01L 2251/5338* (2013.01)

(56) References Cited

U.S. PATENT DOCUMENTS

| | | | |
|---|---|---|---|
| 2012/0219745 A1* | 8/2012 | Fisset | B32B 27/36 428/40.9 |
| 2014/0295150 A1 | 10/2014 | Bower et al. | |
| 2016/0357052 A1 | 12/2016 | Kim et al. | |
| 2017/0294495 A1* | 10/2017 | Shyu | G06F 3/041 |

FOREIGN PATENT DOCUMENTS

| | | | |
|---|---|---|---|
| CN | 104216556 A | | 12/2014 |
| CN | 204463715 U | | 7/2015 |
| CN | 105283311 A | | 1/2016 |
| CN | 106228910 A | | 12/2016 |
| CN | 106252236 A | | 12/2016 |
| CN | 106252378 A | | 12/2016 |
| CN | 106350751 A | * | 1/2017 |
| CN | 106847099 A | | 6/2017 |
| CN | 107180849 A | | 9/2017 |
| CN | 107305906 A | | 10/2017 |
| EP | 1 557 449 A1 | | 1/2004 |
| WO | 2012/084680 A2 | | 6/2012 |

OTHER PUBLICATIONS

Machine translation of WO 2012/084680 A2, Jun. 28, 2012, 11 pages. (Year: 2012).*

* cited by examiner

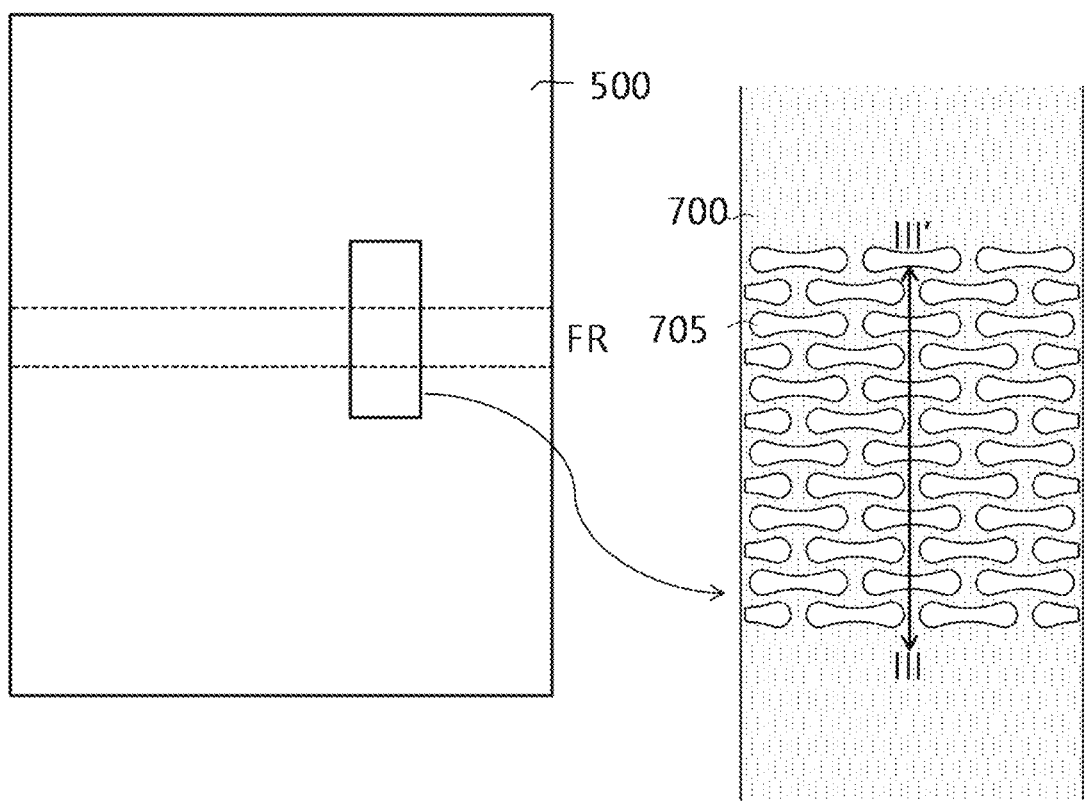

ADHESIVE AND FLEXIBLE DISPLAY USING THE SAME

CROSS-REFERENCE TO RELATED APPLICATION(S)

This application claims the benefit of Korean Patent Application No. 10-2017-0163548, filed on Nov. 30, 2017, which is hereby incorporated by reference as if fully set forth herein.

BACKGROUND

Technical Field

The present disclosure relates to a flexible display, more particularly, to an adhesive which can prevent detachment at the interface with an adhesive layer and easily return to the original state even after repeated folding by changing inner configuration and materials, and a flexible display including the same.

Description of the Related Art

Image displays for displaying a variety of information on a screen are core technologies in the information-technology era and are being developed into slimmer, lighter weight and higher-functional forms. In response to these requirements, organic light emitting diodes and the like, which are capable of spontaneously emitting light and thus do not require a light source unit, attract much attention, as flat panel display devices capable of reducing weight and volume, which are drawbacks of cathode ray tubes.

Organic light emitting displays display an image through a plurality of pixels arranged in the form of a matrix. Each pixel includes a light emitting element and a pixel driving circuit including a plurality of transistors independently operating the light emitting element.

Meanwhile, recently, in terms of various applications, there is increasing demand for a flexible display that can be easily carried in a pocket or a small pouch and can display an image on a larger screen than a portable display. Flexible displays are folded or bent partly when carried or stored, whereas they are opened, when displaying an image, so that an image display area can be increased and a more realistic image can be provided to a user.

A display panel, on which an image is displayed, can be slimmed by decreasing the thickness of a substrate.

In addition, a flexible display includes a back plate disposed under a foldable or bendable flexible display panel to support the display panel and mount the same in a case. The display panel and the back plate are produced through different processes and can be bonded together via an adhesive interposed therebetween because both have no adhesive property.

In this regard, since general adhesives are made of a plastic material such as rubber, after heat- or photo-setting, they remain set and thus have a problem of not suitably responding to folding or bending of display panels. In addition, when an adhesive is made of a material having similar flexibility to the display panel or the back plate by controlling the rigidity thereof, there is a problem that the adhesive exerts adhesion only on the surface where the display panel contacts the back plate so that they can contact each other via a high attractive force, but opposite surfaces of the adhesive are deformed by the difference in length variation, when different attractive forces such as shrinkage and expansion are generated during operation such as folding, and then cannot return to the original condition.

Hereinafter, a folding state of a flexible display according to Comparative Example will be described.

FIG. 1 is a sectional view illustrating a folding state of a flexible display according to Comparative Example.

As shown in FIG. 1, the flexible display according to Comparative Example includes a display panel 10 and a back plate 20 which are bonded together via an adhesive 15 interposed between the entire surfaces thereof. In this case, when the flexible display is folded in half, the display panel 10 folded inside and the back plate 20 folded outside have different radiuses of curvature in the folding region. Accordingly, the display panel 10 and the back plate 20 overlap while having the same size in a non-folding state, whereas, in a folding state, the display panel 10 and the back plate 20 expand while having different radiuses of curvature in a folding region and an area where the back plate 20 having a larger radius of curvature does not overlap the display panel 10, corresponding to the expansion, in a non-folding region of both ends, is formed. This phenomenon is referred to as "slip" between the display panel 10 and the back plate 20.

In addition, during such a folding operation, a first surface and a second surface of the adhesive 15, which contact the display panel 10 and the back plate 20, respectively, have a strain m at opposite ends thereof due to the difference of adhesive surfaces. A sum of strains 2m at two ends is defined as a difference in folding length between the first surface and the second surface.

When the distance (radius of curvature) from the center of the folding region of the display panel 10 to the first surface of the adhesive 15 is set to "R", the folding region has a semicircular cross-sectional surface. For this reason, the length of the folding region on the first surface contacting the display panel 10 corresponds to "$\pi R$". In addition, when the thickness of the adhesive 15 is set to "d", the length of the folding region on the second surface contacting the adhesive 15 corresponds to "$\pi(R+d)$". Accordingly, the equation of $2m = \pi(R+d) - \pi R$ is obtained.

Unless the adhesive 15 is interposed over the entire surface between the display panel 10 and the back plate 20, and has similar flexibility to the display panel 10 or the back plate 20, like the flexible display according to Comparative Example, when the folded flexible display is opened (unfolded) again, the adhesive has difficulty returning to the original state. In this case, a long time is required for the display to return to the original state thereof or it is impossible to unfold the folding region and thus return to the original flat flexible display.

Meanwhile, the aforementioned entire-surface-type adhesive according to the flexible display of Comparative Example can easily return to the original state thereof by improving the rigidity thereof. However, when the rigidity of the adhesive is excessively strong, disadvantageously, the display panel may crack upon repetition of folding and unfolding operations due to increased stress applied to the relatively flexible display panel. In addition, an entire-surface-type adhesive with reduced rigidity takes an excessively long time from a time at which the strain 2m occurs until returning to the original state, despite being unfolded, after folding. An adhesive property is deteriorated at the interface between the display panel contacting the adhesive, and the back plate, thus being disadvantageously inapplicable to devices.

In addition, in the case of a general polymer adhesive, the difference in length variation between an inside surface and an outer surface occurs when slip occurs by folding between both adherends, and then remains as permanent deformation. Accordingly, upon removal of folding stress, the difference in length between both surfaces of the polymer adhesive between adherends, which are flush with each other, is observed as buckling, wrinkling or deformation in a certain part in a flexible display and is seen as a defect to viewers.

BRIEF SUMMARY

Accordingly, the present disclosure is directed to an adhesive and a flexible display including the same that substantially obviate one or more problems due to limitations and disadvantages of the related art.

An object of the present disclosure is to provide an adhesive which is obtained by patterning a metal plate with a predetermined elastic modulus while not causing plastic deformation, so that a plurality of neutral planes are formed upon folding due to material properties and patternization of the metal plate to prevent deformation of the adhesive and enable the adhesive to easily return to the original state thereof upon unfolding.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

The present disclosure provides an adhesive which is compressively deformed in response to an operation of an adherend to be folded, so that the adhesive can easily return to an original state thereof by formation of a plurality of inner neutral planes upon deformation by providing an adhesive which is obtained by patterning a metal plate with a predetermined elastic modulus.

To achieve these objects and other advantages and in accordance with the purpose of the disclosure, as embodied and broadly described herein, an adhesive includes a metal plate having a first surface and a second surface opposing each other, regularly having a plurality of hollows, and having an elastic modulus of 10 GPa to 100 GPa, and an adhesive layer provided on at least one of the first surface and the second surface.

The plurality of hollows may be provided in a thickness direction of the metal plate and pass through the first surface and the second surface.

In addition, the metal plate may be a liquid metal plate.

In addition, the metal plate may include an alloy including zirconium, titanium, nickel and copper.

In addition, the adhesive layer may include, on a plane, a first adhesive layer which corresponds to the first surface excluding hollows of the metal plate, and a second adhesive layer which corresponds to the second surface excluding the hollows of the metal plate.

Alternatively, the adhesive layer may include, on a plane, a first adhesive layer which is flush with the first surface and the hollows of the metal plate. In this case, the adhesive layer may further include a second adhesive layer which corresponds to the second surface excluding hollows of the metal plate. Or, the adhesive layer may further include a second adhesive layer filling the hollows of the metal plate.

The hollows may be provided selectively corresponding to a folding part.

In addition, a region of the metal plate excluding the folding part may be not provided with hollows.

In another aspect of the present disclosure, provided is a flexible display including a display panel including a thin film transistor, an organic light emitting diode array and a sealing layer for sealing the thin film transistor and the organic light emitting diode array, a back plate facing the display panel, and including a folding region and a non-folding region, and the adhesive as described above between the display panel and the back plate.

In addition, a plurality of hollows of the adhesive may be provided in the same folding part as the display panel and the back plate.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings:

FIG. 9 is a plan view illustrating an adhesive according to a third embodiment of the present disclosure.

DETAILED DESCRIPTION

Figure 1:
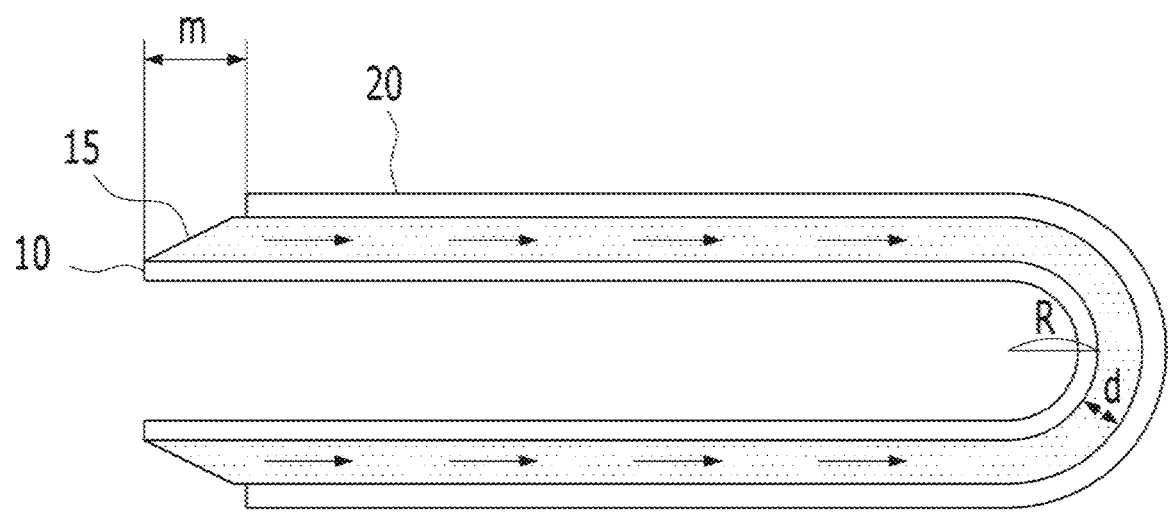
FIG. 1 is a sectional view illustrating a folding state of a flexible display according to Comparative Example.

Reference will now be made in detail to the preferred embodiments of the present disclosure, examples of which are illustrated in the accompanying drawings. In the following description of the present disclosure, substantially the same elements are denoted by the same reference numerals. In the following description, when detailed description of well-known technologies or configurations relating to the present disclosure is deemed to unnecessarily make the subject matter of the present disclosure unclear, detailed explanation thereof will be omitted. In addition, names of constituent components used in the following description may be different from part names of actual products because they are selected in consideration of convenience in drafting of the specification.

In addition, in the description of embodiments, it will be understood that, when one element or layer is referred to as being "on" or "above" another element, one element may directly contact the other element or layer, or one or more intervening elements or layers may also be present between the two elements or layers. In addition, when one element or layer is referred to as "contacting" another element, one or more intervening elements are not present between the two elements or layers.

The sizes and thicknesses of respective elements are illustrated in the drawings for convenience of description and the present disclosure is necessarily not limited to the sizes and thicknesses thereof.

Hereinafter, preferred embodiments of the present disclosure will be described with reference to the annexed drawings.

The display illustrated in the following embodiments represents a foldable display, but a folding region may be located in any part of the display. In the flexible display according to the present disclosure, the location of deformation of a back plate in the folding region can be changed depending on change of the folding region of the flexible display. In addition, the flexible display according to the present disclosure may also be called "foldable", "bendable", "rollable" or the like so long as it is flexible regardless of a bent or folded region.

Figure 2:
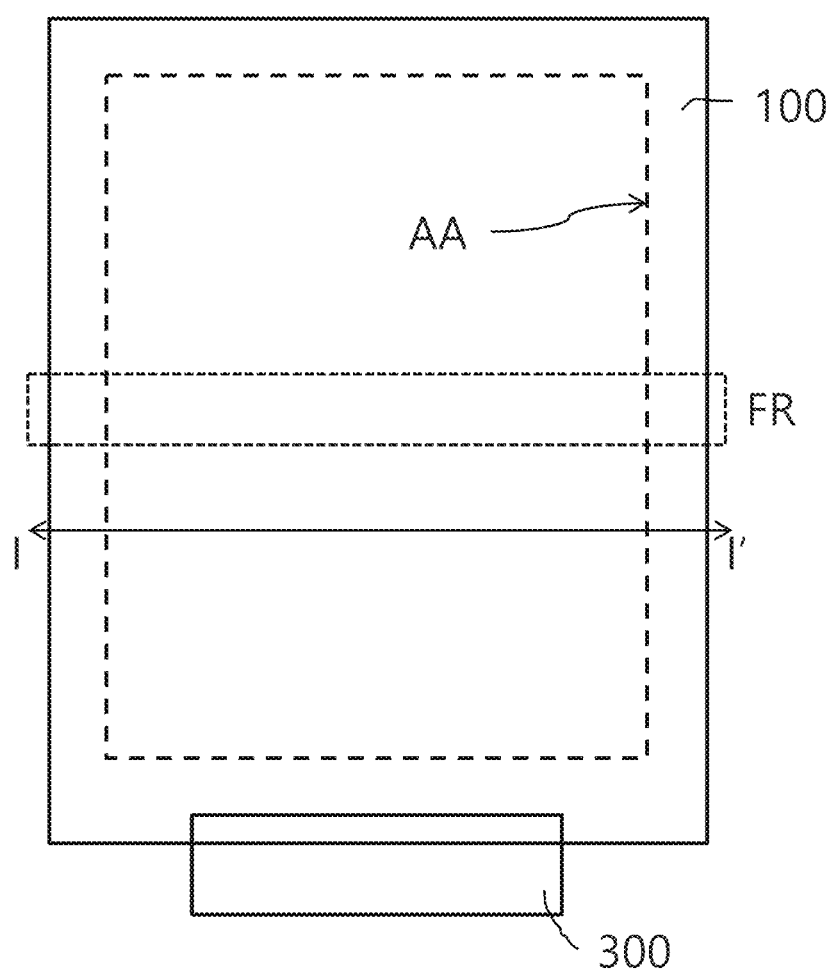
FIG. 2 is a plan view illustrating a flexible display according to the present disclosure.
Figure 3:
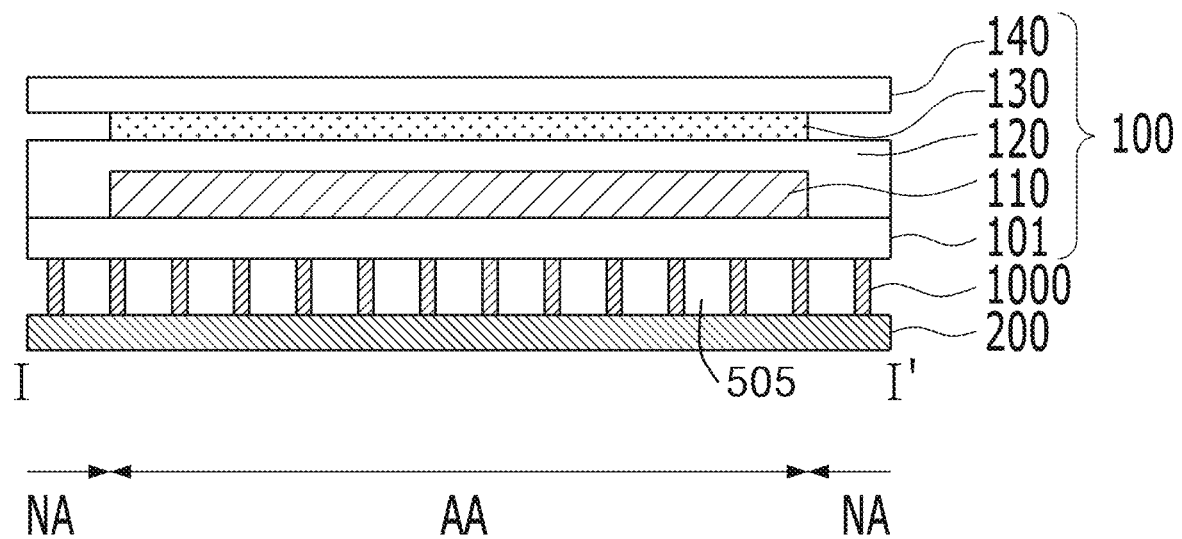
FIG. 3 is a sectional view taken along line I-I' of FIG. 2.

FIG. 2 is a plan view illustrating a flexible display according to the present disclosure and FIG. 3 is a sectional view taken along line I-I' of FIG. 2.

As shown in FIGS. 2 and 3, the flexible display according to the present disclosure includes a display panel 100, a back plate 200 which faces the display panel 100 and supports the bottom of the display panel 10, and a patterned adhesive 1000 interposed between the display panel 100 and the back plate 200.

The patterned adhesive 1000 includes a plurality of hollows 505 in a substrate of a metal plate and will be described in more detail later. FIG. 3 shows only the cross-section of the patterned adhesive 1000 and illustrates the patterned adhesive 1000 which is separated, but hollows are disposed in the form of an island, wherein the metal plate is an integrated form, while excluding the hollows 505.

Here, when the display panel 100 and the back plate 200 are folded along a folding region (FR) in the direction of line I-I', in the folding region FR, the display panel 100 is compressed and the back plate 200 is expanded. In this case, the patterned adhesive 1000 is dispersed by the hollows 505, and plastic deformation does not occur due to small difference in length variation between a first surface facing the display panel 100 and a second surface facing the back plate 200. In particular, the metal plate 1000 is made of a liquid metal plate having an elastic modulus of 10 GPa to 100 GPa, which has high strength comparable to a general metal and excellent elasticity without plastic deformation.

Accordingly, regarding the display panel 100 and the back plate 200 which contact each other, upon folding, as the display panel 100 is compressed and the back plate 200 is expanded, compressive deformation may occur due to stress in an opposite direction to the first and second surfaces. When folding stress is removed, the display panel 100 and the back plate 200 can easily return to the original state thereof due to elastic restoration strength without plastic deformation.

Meanwhile, the display panel 100 of the flexible display according to the present disclosure includes an active area AA which includes a plurality of pixels in the center of the display panel 100 and a non-display area NA which surrounds the periphery of the active area AA.

In addition, the display panel 100 includes a substrate 101, an array 110 including a thin film transistor and an organic light emitting diode in each subpixel provided in the active area AA, a encapsulation layer 120 which seals the thin film transistor and the organic light emitting diode, a touch electrode array 130 provided on the encapsulation layer 120, and a cover layer 140 which protects the touch electrode array 130.

The substrate 101 and the cover layer 140 may be a thin glass or plastic film which has a thickness of 0.2 mm or less and can be flexibly changed in shape without cracking even upon folding. In addition, the substrate 101 and the cover layer 140 may be made of different materials in consideration of light-emission direction and heat-resistance in the process of forming the array 110. When light is emitted upward, the cover layer 140 may be made of a transparent polymer and the substrate 101 may be made of colorful polyimide.

In addition, the array 110 includes a plurality of layers, i.e., an insulation layer, a metal layer and a semiconductor layer, formed on the substrate 101, and each layer has a small thickness of 5,000 Å or less and thus is neither deformed nor cracked even upon folding.

In addition, the encapsulation layer 120 has a thin film laminate which is formed by alternately staking an organic film and an inorganic film and sufficiently covers the top as well as the side surfaces of the active area AA-provided array 110 to prevent exterior humidity or air from permeating into the array 110. That is, the encapsulation layer 120 is formed on the substrate 100 with a size larger than the active area AA, over the edge of the substrate 101, excluding a side at which the pad electrode 145 is provided. In addition, the thicknesses of the organic film and the inorganic film provided in the encapsulation layer 120 are 3 µm or less and 1 µm or less, respectively, the total thickness of the encapsulation layer 120 does not exceed about 20 µm, and the uppermost part of the encapsulation layer 120 may be subjected to planarization due to the relatively thick organic film.

In addition, a touch electrode array 130 is directly formed on the surface of the flat uppermost part of the encapsulation layer 120 or an additional inorganic protective film is further provided thereon, so that the touch electrode array 130 can be provided. In some cases, after the touch electrode array 130 is formed on the inner surface of the cover layer 140, it may be attached to the surface of the encapsulation layer 120.

In addition, the substrate 101 may include a pad part having one side exposed from the encapsulation layer 120, a plurality of pad electrodes 145 are disposed in the pad part and the pad electrodes 145 are connected to a flexible printed circuit board 300. In addition, the flexible printed circuit board 300 is folded toward the bottom of the substrate 101 and is finally accommodated in the structure of a cover bottom (not shown).

The flexible printed circuit board 300 is folded toward the bottom of the substrate 101 and the back plate 200 in the finished flexible display.

Meanwhile, although the back plate 200 having a similar thickness to the substrate 101 is shown in FIG. 2, the back plate 200 is an element which supports a lower part of the substrate 101, and includes a steel alloy like stainless steel or a plastic plate with high rigidity. In this case, the back plate 200 has a thickness which is equal to or greater than that of the entire thickness of the display panel 100. In addition, since the stainless steel has higher rigidity than the display panel 100 due to excellent rigidity and high thickness, it is provided with a plurality of openings (not shown) in the folding region (FR), so that the areas provided with the openings serve as springs, making folding easier.

In addition, a skin layer is provided in upper and lower parts of a core layer which includes the openings of the back plate 200, so that a step can be compensated for and the inner core layer can be protected from exterior shock. As shown in the drawing, the back plate 200 has a configuration in which the core layer and the skin layer provided in upper and lower parts thereof are integrated, excluding the openings. However, the core layer is made of rigid stainless steel, whereas the skin layer is a resin film or inorganic insulation film, which means that the core layer and the skin layer are made of different materials.

The patterned adhesive 1000 shown in FIGS. 2 and 3 has a rectangular cross-section, but may have strain which may cause different widths of parts corresponding to the surfaces each facing the display panel 100 and the back plate 200, and the thickness therebetween. Based on this patterned shape, when compression/expansion forces are applied to both opposite surfaces upon receiving stress by folding or the like, stress is dispersed through formation of a plurality of neutral planes, thereby preventing plastic deformation of the patterned adhesive 1000 due to folding and facilitating return to the original state after folding.

Figure 4:
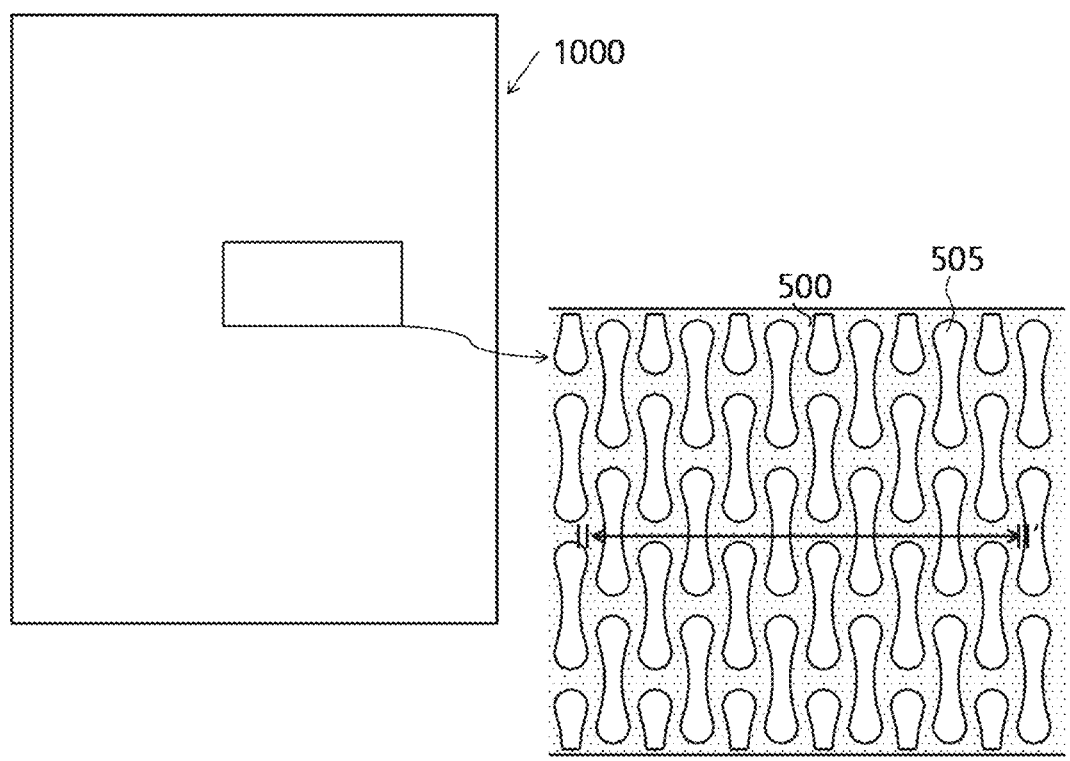
FIG. 4 is a plan view illustrating an adhesive according to a first embodiment of the present disclosure.
Figure 5:
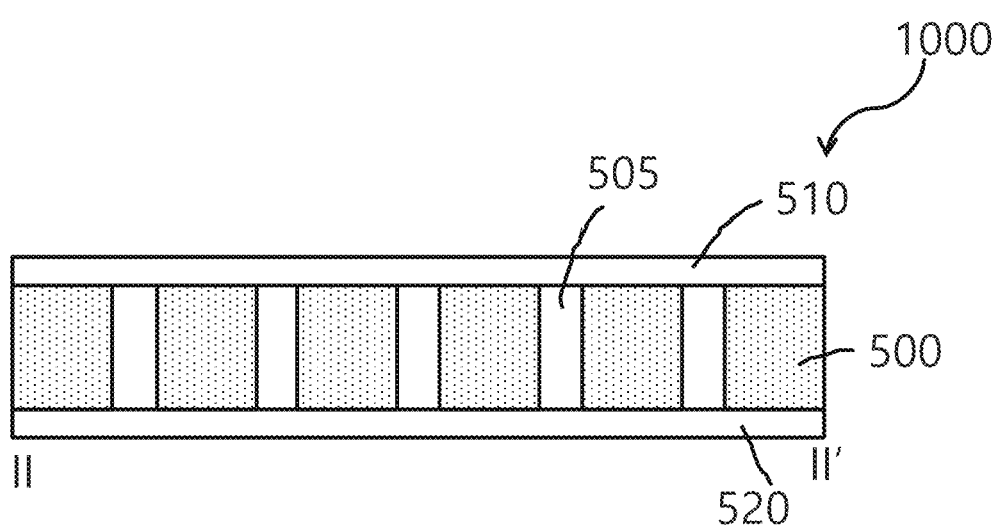
FIG. 5 is a sectional view taken along line II-II' of FIG. 4.

FIG. 4 is a plan view illustrating an adhesive according to a first embodiment of the present disclosure and FIG. 5 is a sectional view taken along line II-II' of FIG. 4.

As shown in FIGS. 4 and 5, the adhesive 1000 according to the first embodiment of the present disclosure includes a first surface and a second surface which opposes each other, a metal plate 500, which has a plurality of hollows 505 regularly disposed and an elastic modulus of 10 GPa to 100 GPa, and a first adhesive layer 510 and a second adhesive layer 520 which contact the first surface and the second surface, respectively.

The metal plate used for the adhesive of the present disclosure is not a general conductive metal, but is a liquid metal plate which is a kind of commonly used material. The liquid metal plate is produced by mixing zirconium with titanium, nickel, copper or the like, molding the mixture and forming a plate with a predetermined thickness. The name of the liquid metal plate is determined because it has a soft surface like a liquid. That is, the liquid metal plate is produced by mixing, not liquid ingredients meant by the name thereof, zirconium with titanium, nickel, copper or the like and quenching the mixture to prevent formation of crystalline grains therein, so that it has excellent elastic force, compared to the thickness thereof, and high strength comparable to titanium which is known to have high rigidity. The metal plate may comprise an alloy including at least one among zirconium, titanium, nickel and copper in order to control its elastic modulus and strength. As such, both excellent elastic force and high strength are not shown in a general metal and are obtained due to use of a certain material like a liquid metal plate. In addition, such a property is greatly different from the aspect that predetermined permanent deformation remains in a general polymer adhesive which contains butyl rubber, styrene butadiene rubber, chloroprene rubber, fluoro-rubber or silicone rubber which is known to have high elasticity. The term "liquid metal" or "liquid metal plate" as used herein therefore does not mean a metal that is in a fluid or liquid phase at room temperature.

The metal plate 500 used for the adhesive 1000 of the present disclosure is patterned by regularly forming hollows 505 by etching a liquid metal plate with a predetermined thickness. Since the hollows 505 are spaced from one another, the metal plate 500 constituting the adhesive 1000 even after formation of the hollows 505 may be an integrated form.

In addition, the first adhesive layer 510 and the second adhesive layer 520 are provided for bonding on both surfaces of the metal plate 500 in the adhesive 1000 corresponding to both adherends. As shown in the drawing, the first and second adhesive layers 510 and 520 may be provided in the form of a sheet, or the first and second adhesive layers 510 and 520 may be formed only in areas of the first and second surfaces, where the metal plate 500 remains, excluding the hollows 505. In some cases, only one of the first and second adhesive layers 510 and 520 may take the form of a sheet, and the other may be patterned in a shape excluding the hollows 505 of the metal plate 500.

In addition, the first and second adhesive layers 510 and 520 may include a urethane acrylate resin or an epoxy resin as a base binder resin including a substantial adhesive ingredient. For example, to synthesize a urethane acrylate resin, as acrylate-based compounds, 9 parts by weight of N-acryloyl morpholine, 8 parts by weight of isobornyl acrylate, 20 parts by weight of 2-phenoxy ethyl acrylate, 20 parts by weight of tetraethylene glycol diacrylate, and 10 parts by weight of tetraethylene glycol are added. In addition, in order to synthesize a urethane prepolymer, 19 parts by weight of polyether polyol and 14 parts by weight of diphenylmethane diisocyanate (MDI) are added. Phenylbis (2,4,6-trimethyl benzoyl-phosphine oxide), which is a long-wavelength (405 nm) initiator, is added as a photoinitiator to cure the acrylate compound.

Here, the first and second adhesive layers 510 and 520 are mentioned as examples and can be changed to other materials that have an adhesive property and have low rigidity not to apply stress to the curve of the adherend.

In the adhesive 1000 according to the first embodiment of the present disclosure, the first and second adhesive layers 510 and 520 have the same low rigidity, and the metal plate 500 has higher rigidity than the first and second adhesive layers 510 and 520.

Figure 6:
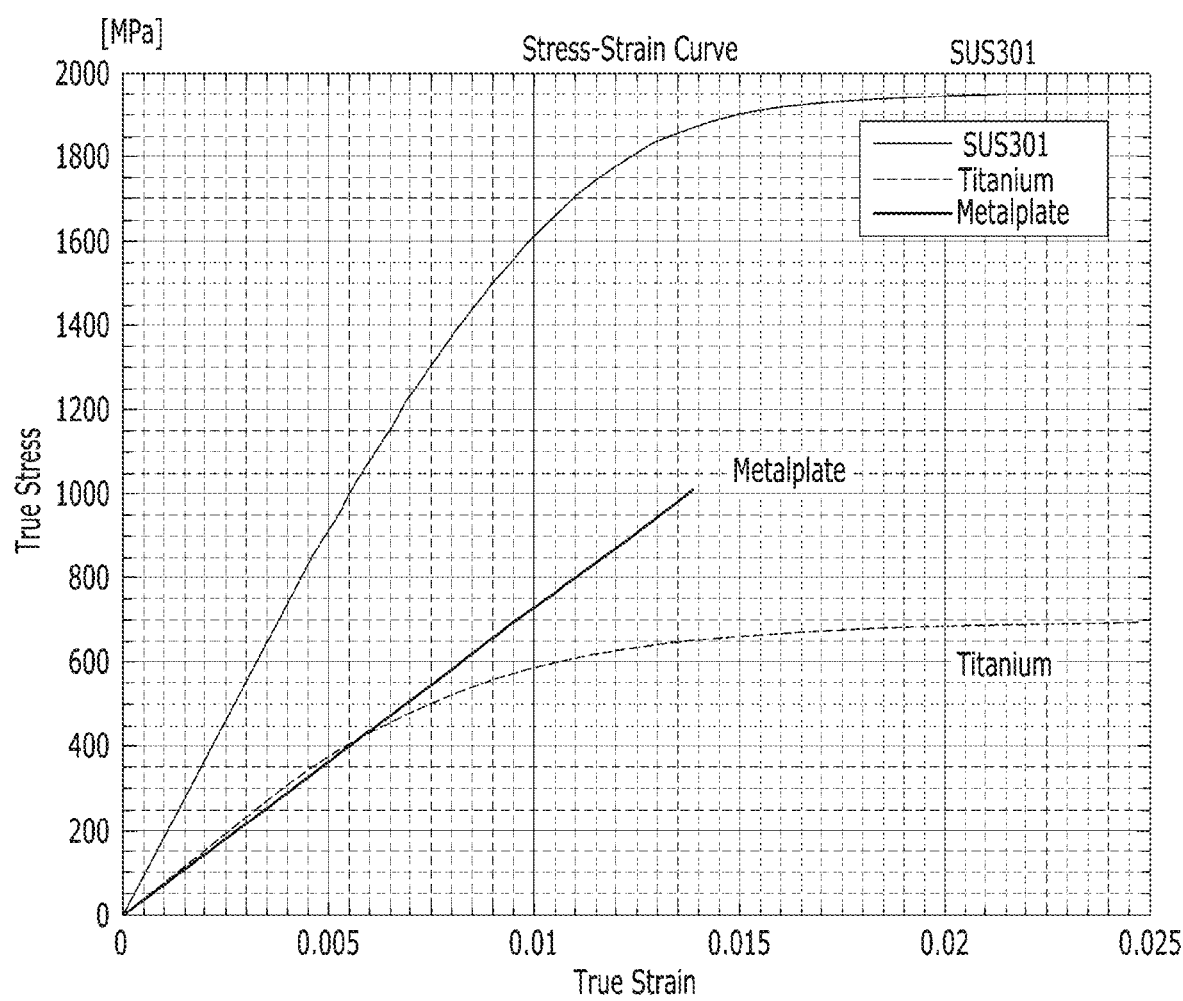
FIG. 6 is a graph showing a stress-strain relationship of materials and other metals used for the adhesive of the present disclosure.

FIG. 6 is a graph showing a stress-strain relationship of materials and other metals used for the adhesive of the present disclosure.

As shown in FIG. 6, the metal plate 500 of the present disclosure has an elastic modulus of 10 GPa to 100 GPa, the elastic modulus of the metal plate 500 is determined by stress/strain, the stress of compressive strength and expansion strength has a tendency of linearly varying in the ratio of the elastic modulus up to a predetermined strain in relation to stress of compression and expansion strength, and then losing the given pattern above the predetermined strain. Here, strain indicates (increased or decreased variation-original length)/original length. This means that the metal plate having a certain elastic modulus according to the present disclosure responds to stress of compressive strength and expansion strength, up to a predetermined strain, without plastic deformation.

On the other hand, materials such as a metal such as titanium or highly rigid stainless steel linearly vary to stress of compressive strength and expansion strength up to the predetermined strain, but have an increase in strain, above the predetermined strain, even if stress is slightly increased.

In particular, when titanium has a strain of 0.5%, variation of stress/strain is serious, which means that, when stress of 400 MPa or more is applied to titanium, unrecoverable variation occurs.

Meanwhile, stainless steel maintains linear stress/strain relationship of compressive strength or expansion strength linear at a strain of 1% or less, but exhibits great variation in strain. That is, stainless steel undergoes an unrecoverable variation when stress of 1,600 MPa or more is applied. In addition, stainless steel has a stress/strain ratio of expansion strength of about 160 GPa and a region where the elastic modulus is considerably high at strain of 1% or less. When converting this into rigidity, stainless steel has excessively high rigidity which is very high compared to the stress generated upon folding or bending of a flexible display. Accordingly, stainless steel cannot follow variation in length according to compression and expansion of the display panel or back plate and causes the problem of slip from the upper or lower display panel or back plate due to high strength itself even though patterned.

Meanwhile, the metal plate of the present disclosure includes, as a base material for the adhesive 1000, a metal plate having a high elastic modulus (62.5 GPa in FIG. 6), thereby rapidly returning to the original state thereof upon removal of folding stress after folding due to increased flexural strength when used as a patterned form, having no time for stress relaxation due to properties of metal and causing no permanent plastic deformation.

That is, the formation of a plurality of neutral planes in the adhesive 1000 according to the first embodiment of the present disclosure means that a plurality of shape-retaining parts are present when attractive force upon folding or the like is applied to the patterned adhesive 1000 between the adherends (see 100 and 200 of FIGS. 2 and 3), which indicates that it is easy for the adhesive 1000 to return to the original state thereof due to less strain of the adhesive 1000.

Figure 7A:
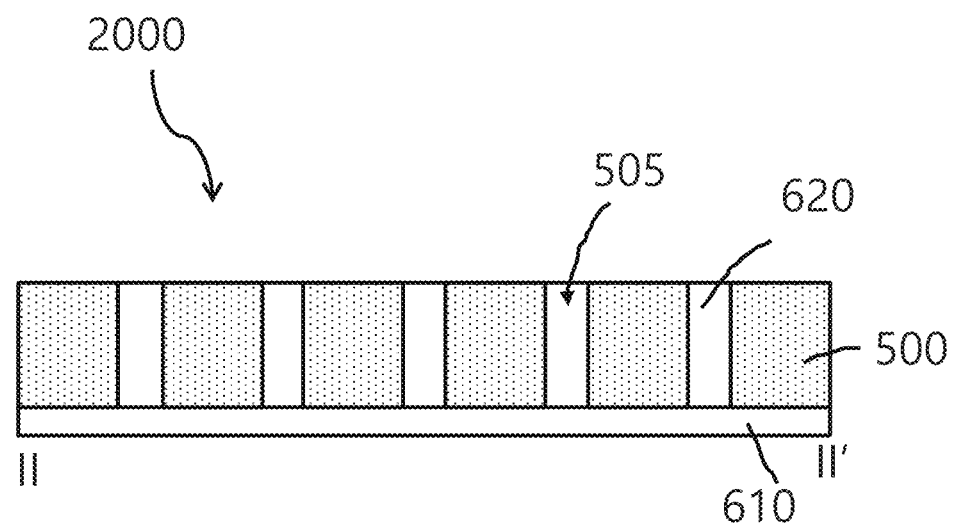
FIG. 7A is a sectional view illustrating an adhesive according to a second embodiment of the present disclosure.
Figure 7B:
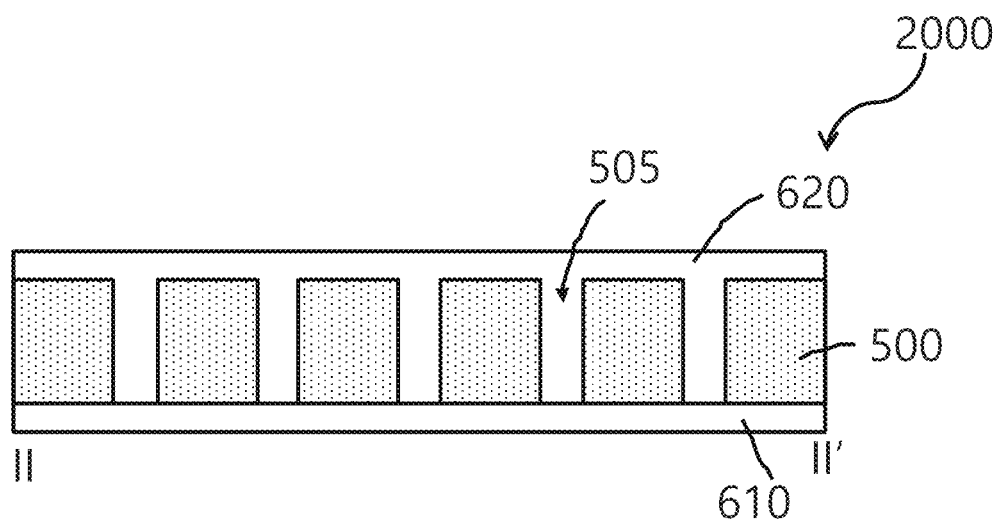
FIG. 7B is a sectional view illustrating a modification example of FIG. 7A.

FIG. 7A is a sectional view illustrating an adhesive according to a second embodiment of the present disclosure and FIG. 7B is a sectional view illustrating a modification example of FIG. 7A.

As shown in FIG. 7A, the adhesive 2000 according to the second embodiment of the present disclosure includes a metal plate 500 having hollows 505, a first adhesive layer 610 which corresponds to the entire surface including the first surface of the metal plate 500 and the hollows 505, and a second adhesive layer 620 filling the hollows 505 of the metal plate 500.

In some cases, as shown in FIG. 7B, according to the modification example of the second embodiment of the present disclosure, upon formation of the adhesive 2000, the second adhesive layer 620 may be formed on the second surface of the metal plate 500. The modification example of the second embodiment of the present disclosure is the same as the second embodiment except for formation of the second adhesive layer 620, and the identical configurations will not be described.

Here, when the first adhesive layer 610 of the adhesive 2000 faces a first adherend (not shown), the second adhesive layer 620 filling the hollows 505 may be bonded to the second adherend (not shown) such that the second adhesive layer 620 faces the second adherend (not shown) in an island form.

Figure 7C:
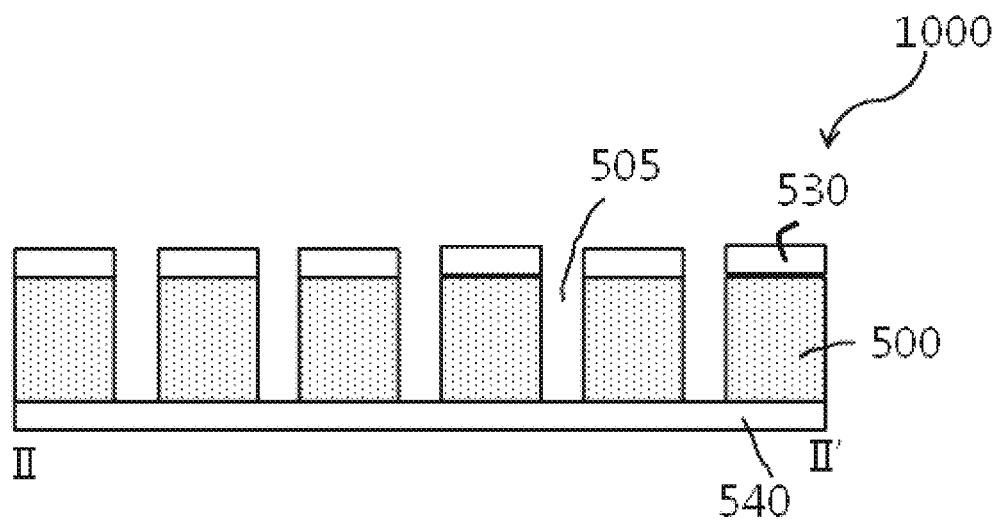
FIG. 7C is a sectional view illustrating a modification example of FIG. 5.

FIG. 7C is a sectional view illustrating a modification example of FIG. 5.

As shown in FIG. 7C, in the modification example of the adhesive according to the first embodiment of the present disclosure, the first adhesive layer 530 is patterned, corresponding to the metal plate 500. This means that the first adhesive layer 530 has holes having the same shape as the hollows provided in the metal plate 500. This modification example of the adhesive according to the first embodiment of the present disclosure can be, for example, implemented by forming a second adhesive layer 540 over the entire surface of the back plate 200, sequentially depositing a metal plate 500 and an adhesive layer material (the same layer as 530), and division-patterning the resulting structure with the same mask to sequentially form a metal plate 500 having hollows 505 and a first adhesive layer 530.

In addition, by switching the location of the shape shown in FIG. 7C and the patterned adhesive layer, the second adhesive layer 540 contacting the back plate 200 can be patterned and the first adhesive layer 530 can be formed over the entire surface in the shape corresponding to the display panel 100 shown in FIG. 2.

Meanwhile, regarding the adhesive shown in the plane view relating to embodiments of the present disclosure, the plane surfaces of the hollows 505 of the metal plate 500 take the shape of a dumbbell which is long along a folding axis and is short in a direction crossing the folding axis. This is provided as an example and any shape which has a long length along a folding axis and a short width in a direction crossing the folding axis may be used. Here, folding is carried out based on the folding axis, and a direction in which compression and extension occur upon substantially folding is the direction crossing the folding axis, so that hollows 505 are repeatedly formed with a short width in the direction crossing the folding axis to make formation of a plurality of neutral planes advantageous in a compression/shrinkage length direction.

In addition, when the hollows 505 are disposed as a plurality of columns, they are not parallel to odd columns and even columns and are arranged diagonally in order to facilitate formation of a plurality of neutral planes. The hollows 505 in odd columns and the hollows 505 in even columns stagger and partly overlap with each other.

Meanwhile, in the aforementioned embodiment of the adhesive, the metal plate 500, which is a base material (substrate) for the adhesive, has a thickness of about 10 μm to 20 μm, and the adhesive layers taking a flat shape have a thickness of about 3 μm to 7 μm, so that the metal plate 500 controls the overall elasticity and rigidity of the adhesive 1000, based on relatively high thickness compared to the adhesive layers 510 and 520.

In the above embodiments (FIGS. 7A~7C), the metal plate 500 has higher rigidity than the first and second adhesive layers 610 and 620 or 530 and 540.

Figure 8A:
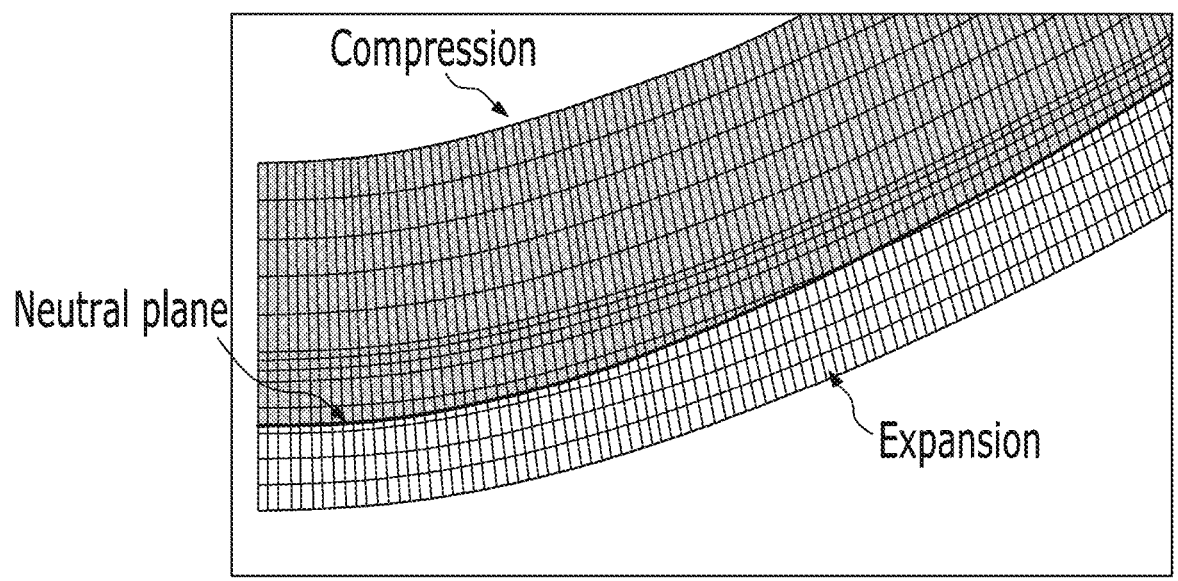
FIG. 8A shows a neutral plane of an entire-surface-type adhesive.
Figure 8B:
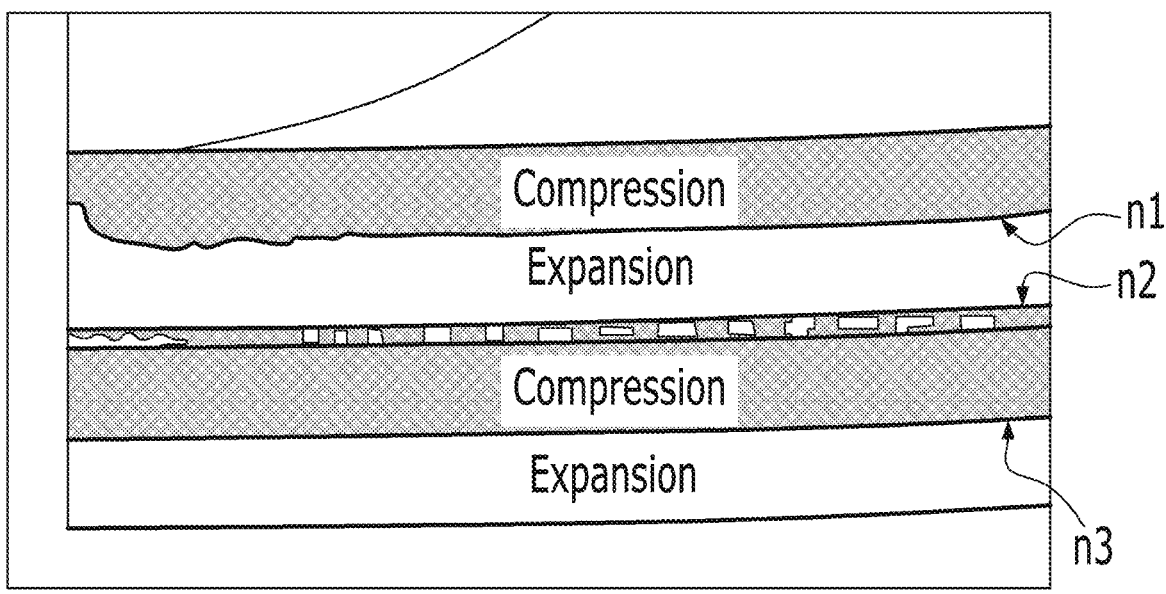
FIG. 8B shows a neutral plane of an adhesive according to the present disclosure.

FIG. 8A shows a neutral plane of an entire-surface-type adhesive and FIG. 8B shows a neutral plane of an adhesive according to the present disclosure.

As shown in FIG. 8A, when an entire-surface-type adhesive is generally bent, the neutral plane of compression and extension is formed only on the middle surface of an upper surface and a lower surface of the entire-surface-type adhesive. In this regard, as shown in FIG. 5, the adhesive of the present disclosure is provided with hollows 505 in a direction passing through the upper surface (first surface) and the lower surface (second surface), so that a plurality of surfaces (n1, n2, n3) on which neutrality of compressive strength and extension strength occurs by folding are created in a direction of the thickness of the metal plate 500 of FIG. 8B. As a result, other compression and extension forces applied are dispersed, so that the difference in length between the upper surface (first surface) and the lower surface (second surface) of the metal plate 500 upon folding is decreased, so that deformation of the metal plate 500 upon folding is prevented. The neutral planes are preferably created in a curved form, rather than a linear form, in a length or width direction of the hollows 505.

In the aforementioned embodiment of patterned adhesives, hollows 505 are provided over the entire region facing the display panel 100 and the back plate 200. However, the present disclosure is not limited to this configuration and the hollows of the adhesive may be selectively provided only in a specific region where folding occurs.

Figure 10:
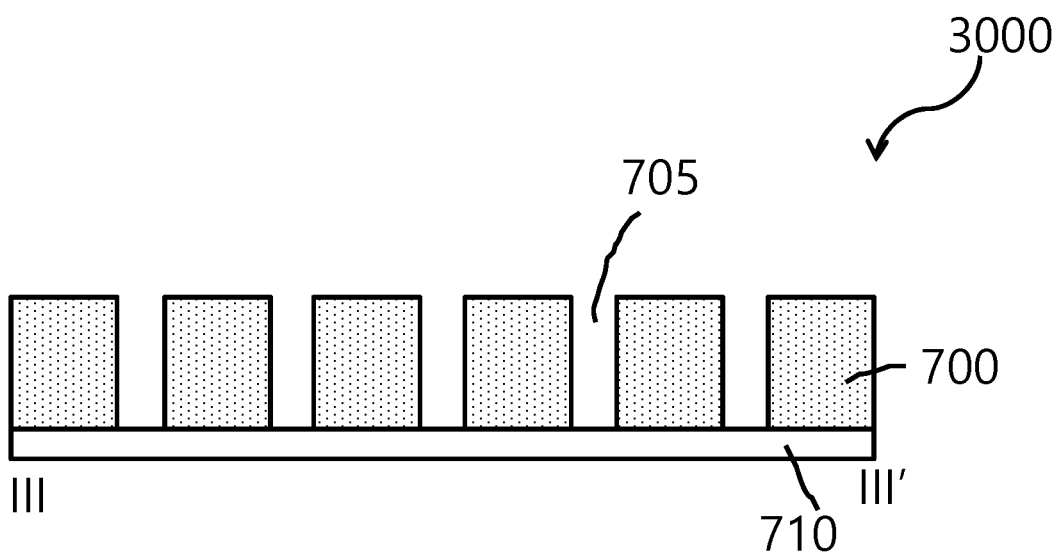
FIG. 10 is a sectional view taken along line III-III' of FIG. 9.

FIG. 9 is a plan view illustrating an adhesive according to a third embodiment of the present disclosure and FIG. 10 is a sectional view taken along III-III' of FIG. 9.

As shown in FIGS. 9 and 10, the adhesive 3000 according to the third embodiment of the present disclosure is provided with a plurality of hollows 705 only in a region corresponding to the folding region FR, and is provided with a first adhesive layer 710 in the remaining region in a thickness direction in the metal plate 700 and at least one of the first surface and the second surface facing each other of the metal plate 700.

As described in the first embodiment and the second embodiment or a modification example thereof, the adhesive 3000 according to the third embodiment of the present disclosure may be provided with a second adhesive layer, while filling hollows 705, or the adhesive layer may be provided as a plane shape of the adherends of the display panel 100 and the back plate 200 which each face both surfaces of the metal plate 700, or a patterned adhesive layer excluding the hollows 705 may be provided.

As described above, the adhesive of the present disclosure and the flexible display including the same have the following effects.

First, the adhesive of the present disclosure includes, as a base material, a metal plate which has no plastic deformation and has a high elastic modulus of 10 GPa to 100 GPa, and is provided in the metal plate with hollows spaced from one another to create a predetermined pattern, so that a plurality of neutral planes, on which neutrality of compression and extension during folding is created, can be provided and, as a result, deformation of adhesives by repeated folding can be prevented.

Second, when the adhesive is formed using a highly rigid material like stainless steel or a general metal, restoration is high, but in response to this, stress is created in a display panel, disadvantageously causing cracks, and, when the adhesive is formed using a weak rigid material like a polymer, the display panel does not crack due to flexibility, but the polymer requires a relaxation time of one day or longer to return to the original shape after receiving stress, thus being inapplicable to flexible displays. The adhesive of the present disclosure is provided in, as a base material, a metal plate which is moldable, has no internal crystallinity and has an elastic modulus not less than a predetermined level, like a liquid metal. Accordingly, the adhesive of the present disclosure operates without any slip in response to other forces applied to other facing surfaces between the display panel and the back plate upon folding due to high restoration force of the material and formation of a plurality of neutral planes for dispersing stress applied upon folding, and is advantageous for application to a flexible display due to high elastic modulus and thus high restoration force of returning to the original state upon removal of folding stress.

In addition, although the preferred embodiments of the present disclosure have been disclosed for illustrative purposes with reference to the annexed drawings, it will be apparent to those skilled in the art that the present disclosure is not limited to the same configurations, actions and effects as the specific embodiments, and various modifications and variations can be made in the present disclosure without departing from the spirit or scope of the disclosure. Accordingly, it is intended that such modifications and alterations fall within the scope of the present disclosure and the true technical protection scope of the disclosure is defined by the technical spirit of the appended claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An adhesive, comprising:
a metal plate including a metal body having a top surface and a bottom surface opposite to the top surface with a first thickness between the top and the bottom surfaces, and a plurality of hollows regularly spaced apart from each other among the metal body;
a first adhesive layer covering the top surface; and
a second adhesive layer covering the bottom surface,
wherein the metal body has an elastic modulus of between 10 GPa and 100 GPa,
wherein each of the plurality of hollows is extended in a thickness direction of the metal plate and has the first thickness,
wherein the first adhesive layer is singly structured on the top surface of the metal plate, and
the second adhesive layer is one sheet corresponding to the bottom surface and the plurality of hollows of the metal plate.

2. An adhesive, comprising:
a metal plate including a metal body having a top surface and a bottom surface opposite to the top surface with a first thickness between the top and the bottom surfaces, and a plurality of hollows regularly spaced apart from each other among the metal body;
a first adhesive layer covering the top surface; and
a second adhesive layer covering the bottom surface,
wherein the metal body has an elastic modulus of between 10 GPa and 100 GPa,
wherein each of the plurality of hollows is extended in a thickness direction of the metal plate and has the first thickness,
wherein the first adhesive layer is singly structured and is provided on the top surface of the metal plate and fills the plurality of hollows, and
wherein the second adhesive layer is singly structured on the bottom surface of the metal plate.

3. The adhesive according to claim 2, wherein material of the metal body is fully removed to penetrate the top surface and the bottom surface at each of the plurality of hollows.

4. The adhesive according to claim 2, wherein the metal plate is a liquid metal plate.

5. The adhesive according to claim 2, wherein the metal plate comprises an alloy including at least one material chosen from zirconium, titanium, nickel, and copper.

6. The adhesive according to claim 2, wherein the first adhesive layer fills the plurality of hollows and contacts the second adhesive layer.

7. The adhesive according to claim 2, wherein the plurality of hollows are provided in a folding part of the metal plate.

8. The adhesive according to claim 7, wherein a region of the metal plate other than the folding part is not provided with hollows.

9. The adhesive according to claim 2, wherein the first and second adhesive layers include a urethane acrylate resin or an epoxy resin as a base binder resin.

10. The adhesive according to claim 2, wherein the metal plate has higher rigidity than the first and second adhesive layers.

11. The adhesive according to claim 2, wherein the hollows are disposed as a plurality of columns, and the hollows in odd columns and the hollows in even columns stagger and partly overlap with each other.

12. The adhesive according to claim 2, wherein the metal plate is amorphous without any grain within the metal plate.

\* \* \* \* \*